United States Patent [19]

Schooley et al.

[11] 4,101,424
[45] Jul. 18, 1978

[54] WATER JACKET FOR ULTRAVIOLET LAMP

[75] Inventors: Willard A. Schooley, Denville, N.J.; Robert E. Browne, E. Northport, N.Y.

[73] Assignee: Sun Chemical Corporation, New York, N.Y.

[21] Appl. No.: 731,427

[22] Filed: Oct. 12, 1976

Related U.S. Application Data

[63] Continuation of Ser. No. 579,834, May 22, 1975, abandoned.

[51] Int. Cl.² .............................................. G01J 1/00
[52] U.S. Cl. ............................... 250/504; 250/492 R
[58] Field of Search ............... 250/493, 494, 504, 436, 250/453, 454, 455, 492 R; 350/288, 293; 34/1, 4; 313/22, 26

[56] References Cited

U.S. PATENT DOCUMENTS

| | | | |
|---|---|---|---|
| 2,114,173 | 4/1938 | Boerstler | 250/504 |
| 2,223,470 | 12/1940 | Alphen et al. | 250/504 |
| 3,831,289 | 8/1974 | Knight | 250/504 |
| 3,960,081 | 6/1976 | Gustaus et al. | 101/416 A |

Primary Examiner—Bruce C. Anderson
Attorney, Agent, or Firm—Cynthia Berlow

[57] ABSTRACT

An elongated ultraviolet lamp is surrounded by a water-conducting jacket which serves as a heat sink for the lamp. The water-conducting jacket is made of quartz which is transparent to ultraviolet radiation and a semi-cylindrical reflective coating is formed on the quartz to serve as a reflector to direct ultraviolet radiation toward one side of the lamp. The water jacket is formed alternately of radially spaced quartz tubes which surround the lamp and conduct deionized water therebetween or is, alternatively, formed of a single tube directly surrounding the lamp, with water flowing over the surface of the lamp and between the lamp and the surrounding quartz tube. The lamp may be placed off center to define a lens-type pattern to assist in the focusing of ultra-violet light to one side of the lamp. The quartz jacket may have a thickened region to serve as a focusing lens on the side of the lamp opposite the reflective coating.

18 Claims, 8 Drawing Figures

WATER JACKET FOR ULTRAVIOLET LAMP

This is a continuation of application Ser. No. 579,834, filed May 22, 1975 abandoned.

BACKGROUND OF THE INVENTION

This invention relates to ultraviolet lamp assemblies, particularly useful for the curing of photopolymerizable materials, and more specifically relates to a novel ultraviolet lamp assembly in which a water jacket directly surrounds the lamp in order to cool the lamp. A reflective coating is formed on a wall of the water jacket in order to direct ultraviolet radiation toward a focused region to one side of the lamp or toward a substrate.

The use of ultraviolet lamps is well known for curing photopolymerizable materials, such as photopolymerizable ink. Such ink, printed on a suitable substrate, is substantially instantaneously cured upon exposure to intense ultraviolet radiation. Ultraviolet curing ovens for producing intense ultraviolet light for this purpose are shown, for example, in U.S. Pat. No. 3,733,709 to Bassemir et al, U.S. Pat. No. 3,745,307 to Peek et al, U.S. Pat. No. 3,826,014 to Helding, and U.S. Pat. No. 3,840,999 to Whelan, each of which is assigned to the assignee of the present invention.

The operation of conventional ultraviolet lamps generates substantial heat as well as the ultraviolet radiation which is used for the curing of the photopolymerizable materials.

The heat or non-ultraviolet energy which is produced by the lamp must be efficiently removed from the lamp region to prevent damage to the lamp apparatus and to the substrate carrying the photopolymerizable material to be cured. Thus, extremely bulky apparatus is now in use which utilizes water-cooling conduits or air channels embedded in large heat sinks adjacent the lamp structure in order to remove the heat from the lamp as efficiently as possible. Presently existing ultraviolet lamp apparatus also produces extremely large quantities of ozone and the ozone must be removed efficiently from the equipment, thereby requiring relatively large air evacuation and handling ducts for sweeping ozone across the lamps and around the lamp reflectors.

The intense heat produced by the lamps is especially damaging to paper webs or sheets being carried through the curing oven when the sheets slow down or are stopped; therefore, it is common practice to reduce lamp power and to provide shutters which can be moved between the lamps and the web in order to block radiation which might fall on the web when it is stopped and to absorb the heat produced by the lamps so that the web or sheets being transported through the oven are not charred or burned. These shutters are usually relatively massive structures and are frequently provided with water-cooling conduits to conduct away the heat produced in the shutters by the adjacent lamp structures. The lamp power is not turned off when the web is temporarily stopped since the lamp would have to cool down for several minutes before it can be reignited.

BRIEF DESCRIPTION OF THE PRESENT INVENTION

In accordance with the present invention, a novel cooling system and reflector is provided for an ultraviolet lamp which is used for curing photopolymerizable materials wherein the fluid-cooling system and reflector are extremely low in mass and volume. More particularly, in accordance with the invention, a novel water jacket is formed by at least one quartz cylinder which surrounds the ultraviolet lamp and a cooling fluid, which could be water or any other desired fluid, passes through the quartz jacket in order to absorb heat from the lamp and remove this heat to a suitable heat-transfer region. A reflective coating is then formed either directly on the quartz jacket or on the lamp in order to reflect the ultraviolet radiation of the lamp toward a focused band which is to one side of the lamp and which lies in the general plane occupied by the substrate carrying the photopolymerizable material to be cured.

In one embodiment of the invention, two quartz cylinders are telescoped inside of one another to define an annular water channel surrounding the lamp and in good thermal contact with the lamp; in a second embodiment of the invention the outer wall of the lamp quartz envelope serves as the inner wall of the water channel.

The reflector structure is then formed by depositing a reflective coating on about half the circumference of one of the surfaces of the quartz water jacket or of the lamp so that ultraviolet radiation is reflected from the reflective surface and down through the interior of the quartz jacket and then through the quartz jacket walls and to the area upon which the radiation is to be focused. Note that quartz is substantially transparent to ultraviolet radiation and thus is the preferred material for the jacket.

In accordance with further embodiments of the invention, the lamp may be placed off-axis within the water-cooling jacket, thereby to form a lens effect for radiation being reflected from the reflector coating above the lamp. A further lens effect may be formed by thickening one side of the quartz jacket directly or indirectly by adding an element, thereby enabling the focusing of a greater percentage of the ultraviolet radiation produced by the lamp and reflected by the semicircular reflective coating on the water jacket or on the lamp.

The use of the novel water jacket arrangement and reflective surface mounted directly on the water jacket allows the ultraviolet radiation source to be extremely compact and allows a relatively cool substrate and source, thereby either doing away with shutters or substantially simplifying any desired shutter configuration. Moreover, expensive external reflectors and reflector support structures are eliminated and little or no ozone exhaust is required.

DETAILED DESCRIPTION OF THE DRAWINGS

Figure 1:
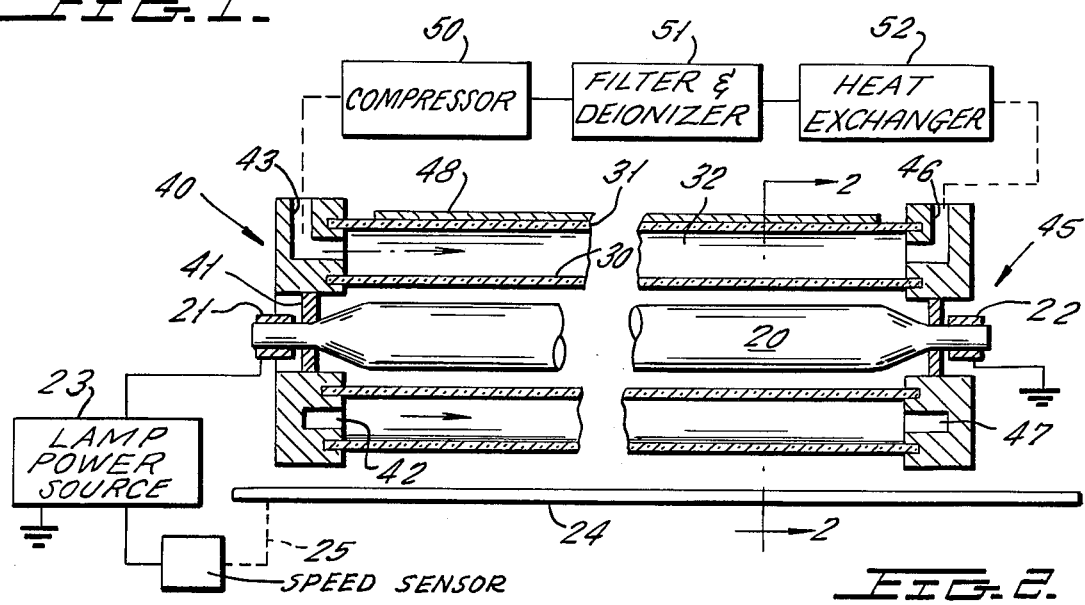
FIG. 1 is a longitudinal cross-sectional view of an ultraviolet lamp with surrounding water jacket and semicircular reflector constructed in accordance with the present invention.
Figure 2:
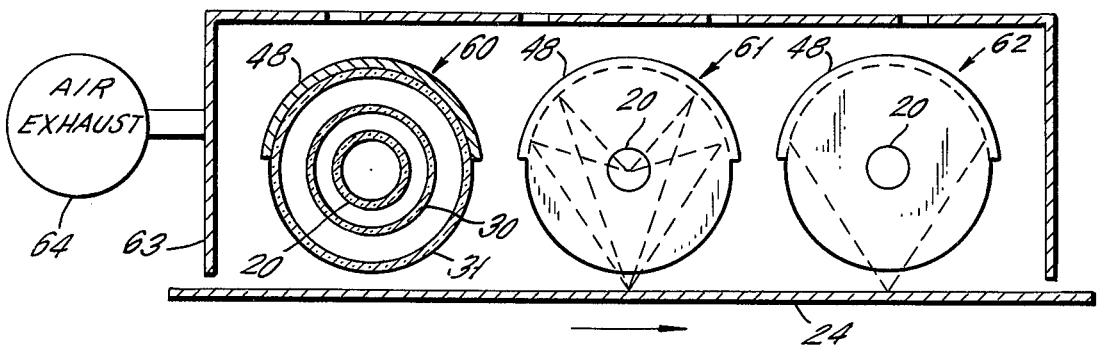
FIG. 2 is a cross-sectional view of FIG. 1 taken across the section line 2—2 in FIG. 1.

Referring first to FIGS. 1 and 2, there is illustrated therein an ultraviolet lamp 20 which may be of a commercially available type of lamp which could have a length, for example, of 60 inches and an outer diameter of about 25 mm. Lamp 20, as shown in FIG. 1, has suitable end electrodes 21 and 22 which are connected to a suitable lamp power source 23 in order to energize the lamp 20 in appropriate and well-known manner. The lamp 20 is intended to provide ultraviolet radiation for the purpose of curing photopolymerizable materials of any desired type such as inks, adhesives or the like, which appear on a moving or stationary substrate 24. In the case of a moving substrate, it may move in the direction shown by the arrow in FIG. 2.

In a conventional system, the lamp power source 23 will be operatively connected to the mechanism for moving the substrate 24 as illustrated by the dotted-line connection 25 in FIG. 1, such that, when the substrate 24 slows down or is temporarily stopped, the power applied to the lamp 20 by power source 23 will be reduced. In systems using a non-moving substrate, the lamp power can also be controlled to be decreased when the substrate is not in place.

In accordance with the invention, two quartz tubes 30 and 31 symmetrically surround the lamp 20 and form an annular channel 32 which carries a fluid cooling medium from the left to the right in FIG. 1 for the purpose of cooling lamp 20. The tubes or jackets 30 and 31 are preferably of clear fused quartz since this quartz is transparent to ultraviolet radiation and is capable of withstanding the substantial heat which is produced by the operation of lamp 20.

The jacket 30 may have an inner diameter of about 30 mm and a thickness of 1 mm. The quartz tube 31 may have an inner diameter of about 50 mm and a thickness of 2 mm, whereby the channel 32 has a radial thickness of 9 mm for the passage of a cooling fluid, such as water, therethrough.

The left-hand end of tubes 20, 30 and 31 are supported by a brass fitting 40 which has suitably gasketed end wall slots for receiving tubes 30 and 31 and a suitable central baffle 41 for receiving the left-hand end of tube 20 and positioning the tube 20 relative to the interior of inner quartz jacket 30. The brass fitting 40 will also have an annular channel 42 therein which communicates with the input fitting opening 43.

The right-hand end of tube 20 and tubes 30 and 31 are fitted with the brass fitting 45 which is identical in construction to fitting 40 and has an outlet fitting 46 which communicates with annular channel 47.

The exterior of quartz water jacket tube 31 is then provided with a reflective coating 48, where the reflective coating is semicircular in configuration and extends from essentially the full length of the tube 31 and of lamp 20. The reflective coating 48 will then serve as a reflector which will generally focus the ultraviolet radiation of lamp 20 toward a focal plane in the general vicinity of the substrate 24. The reflective coating 48 may be formed by any suitable process and can be an appropriate metal or metal oxide coating or the like on tube 31 where the coating is selected to be highly reflective to ultraviolet radiation.

The inlet and outlet regions 43 and 46 are then connected in series with a suitable compressor 50, a filter arrangement which could include a deionizer 51 and a heat exchanger 52. The system may then be filled with a suitable cooling fluid, such as distilled water, and the filtered and deionized water is circulated through annular channel 32 in the direction shown by the arrows in FIG. 1.

It has been found that a flow rate of about 2.0 gallons per minute through the channel 32 will produce effective cooling of the lamp 20, with the water temperature being at about 25° C. at input fitting opening 43 and about 32° C. at outlet fitting 46.

Note that the cooling system need not be a closed system as shown, and that an open system could be used where the heated fluid from outlet fitting 46 is discharged to the external environment.

FIG. 2 illustrates three identical parallel lamp assemblies 60, 61 and 62, each identical to the lamp shown in FIG. 1, mounted relative to the substrate 24. It should be noted that any desired number of lamp assemblies could be used. Moreover, it should be noted that shutters could be interposed between the lamp assemblies and the substrate 24, if desired, although the use of shutters is not as important as in prior art arrangements since the heat produced by the lamp 20 is effectively removed by the water jacket surrounding lamp 20.

FIG. 2 further illustrates a hood 63 enclosing assemblies 60 to 62 with an air exhaust means 64 connected to the hood 63. The air exhaust means 64 enables the withdrawal of any ozone which is produced within the hood 63. Hood 63 shields the lamps from personnel working in the vicinity of the lamps.

Figure 8:
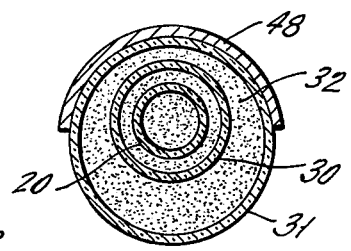
FIG. 8 shows a still further embodiment of the invention in cross-sectional view wherein the water jacket is elliptical in cross-section.

Since tube 31 is circular in cross-section, the reflector 48 will be a semicylindrical or of any other configuration reflector chosen by the designer. Tube 31 could also be formed elliptically or partly parabolic in cross-section to further concentrate or focus energy on the substrate 24 by the correspondingly shaped reflector 48. The concentration of the rays generated by lamp 20 may be optimized by placing the lamp 20 on the elliptical or parabolic focus of tube 31. See FIG. 8.

In FIGS. 1 and 2 the reflective coating 48 is disposed on the outside surface of outer water jacket 31. In the embodiment of the invention shown in FIG. 3 components similar to those to FIGS. 1 and 2 have been given similar identifying numerals and the reflective coating is placed on inner quartz jacket 30 as the reflective coating 70.

Figures 3, 4:
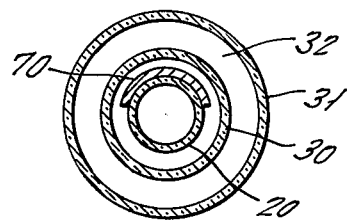
FIG. 3 is a cross-sectional view of a second embodiment of an ultraviolet lamp with surrounding water jacket and reflector surface wherein the reflector surface is formed on the interior of the water jacket combination.
FIG. 4 shows a further embodiment of the invention similar to FIG. 1 except that the reflective coating is formed directly on the lamp surface.

FIG. 4 shows a further embodiment of the invention where the reflective coating is placed directly on the quartz envelope of lamp 20 as the semicylindrical reflective coating 71. In all other respects, the embodiments of FIGS. 3 and 4 are identical to that of FIGS. 1 and 2.

Figure 5:
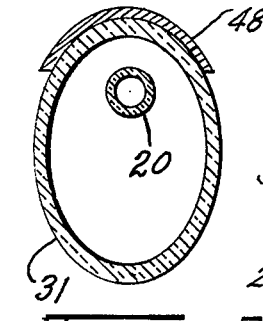
FIG. 5 shows a still further embodiment of the invention which is generally similar to that of the lamps of FIGS. 1 and 2 where, however, the lamp is placed off-axis relative to the outer quartz cylinder of the water jacket in order to define a lens effect for radiation passing through the water-filled jacket.

FIG. 5 shows a still further embodiment of the invention which is similar to that of FIGS. 1 and 2 except that the axis of lamp 20 and the axis of inner quartz jacket 30 have been displaced upwardly and toward reflective coating 48 relative to the axis of the outer jacket 31. Consequently, the water-filled channel 32 now has a thickened bottom region which gradually tapers to a thinner section in the fashion of a convex lens which is wrapped around the lamp 20. The formation of this lens effect within the region 32 will cause the focusing of a greater percentage of the radiation of lamp 20 toward a band of focused radiation on the web or substrate 24 of FIG. 2.

Figure 6:
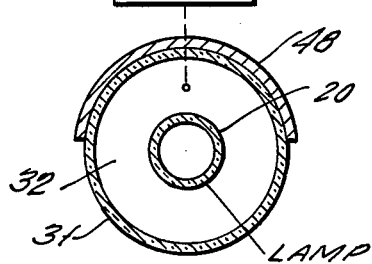
FIG. 6 shows a still further embodiment of the invention wherein the water jacket is formed directly between the outer surface of the ultraviolet lamp and the interior of a single surrounding quartz tube.

FIG. 6 shows another embodiment of the invention in cross-sectional view and is similar to the arrangement of FIGS. 1, 2 or 5 except that the inner quartz jacket 31 has been removed so that the water-conducting region 32 is now defined directly between the outer jacket 31 and the outer surface of the lamp 20.

In the arrangement of FIG. 6, the lamp 20 is directly immersed in the cooling fluid in the channel 32 and is most efficiently cooled. Note that the semicircular reflector 48 is formed directly on the single quartz jacket 31 in FIG. 6.

Figure 7:
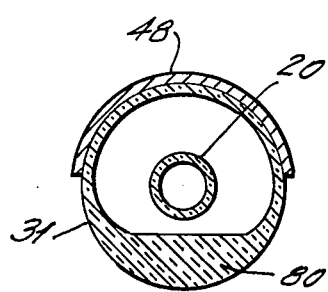
FIG. 7 shows still a further embodiment of the invention in cross-sectional view wherein one side of the quartz jacket is thickened to define a lens effect for radiation passing therethrough.

FIG. 7 shows a modification of the arrangement of FIG. 6 wherein the bottom region 80 of jacket 31 has been thickened to define an elongated convex lens to assist in the focusing of radiation from the lamp 20. Note that a lens effect can also be provided by moving the lamp 20 in FIG. 6 upwardly relative to the axis of jacket 31 to form the lens effect shown in FIG. 5.

Although this invention has been described with respect to preferred embodiments, it should be understood that many variations and modifications will now be obvious to those skilled in the art, and it is preferred, therefore, that the scope of this invention be limited, not by the specific disclosure herein, but only by the appended claims.

The embodiments of the invention in which an exclusive privilege or property is claimed are defined as follows:

1. An ultraviolet lamp assembly for producing a generally focused band of ultraviolet radiation comprising, in combination:
    an elongated ultraviolet radiation producing lamp having spaced terminals;
    electrical power source means connected to said spaced terminals for energizing said lamp;
    an elongated liquid-conducting jacket surrounding said lamp and being substantially coextensive with said lamp; said jacket being of a material which is substantially transparent to ultraviolet radiation;
    a source of cooling liquid connected to said liquid-conducting jacket and circulating cooling liquid down the length of said jacket; said lamp being thermally coupled to said cooling liquid, whereby a portion of the heat produced by said lamp is transferred to said cooling liquid and is removed from the vicinity of said lamp;
    means for deionizing said cooling liquid;
    and elongated curved reflector means at least partly surrounding said lamp and intercepting at least a part of the radiation of said lamp and reflecting and generally focusing a part of said radiation into said generally focused band.

2. The device of claim 1 wherein said jacket is of clear fused quartz.

3. The device of claim 1 wherein said jacket consists of first and second radially spaced concentric quartz cylinders; said cooling liquid moving through the annular space between said first and second quartz cylinders.

4. The device of claim 1 wherein said jacket consists of a single quartz cylinder surrounding and being radially spaced from said lamp, whereby said cooling liquid is in direct contact with the outer diameter of said lamp.

5. The device of claim 1 wherein said reflector means comprises a reflective coating formed on an outer surface region of said jacket.

6. The device of claim 1 wherein said reflector means comprises a reflective coating formed on the outer surface of said lamp.

7. The device of claim 3 wherein said reflector means comprises a reflective coating formed on a surface region of one of said first or second spaced concentric quartz cylinders.

8. The device of claim 4 wherein said reflector means comprises a reflective coating formed on an outer surface region of said jacket.

9. The device of claim 7 wherein said first cylinder has a greater diameter than said second cylinder; said reflective coating being formed on the outer surface of said first cylinder.

10. The device of claim 1 wherein said jacket is generally cylindrical in cross-section, and wherein the axis of said lamp is displaced from the axis of said jacket, whereby the liquid within said jacket defines a focusing lens for radiation from said lamp.

11. A lamp assembly for curing photopolymerizable materials on a substrate which moves relative to said lamp assembly and which receives a focused band of radiation from said lamp assembly; said lamp assembly comprising, in combination:
    an elongated ultraviolet radiation producing lamp having spaced terminals;
    electrical power source means connected to said spaced terminals for energizing said lamp;
    an elongated liquid-conducting quartz jacket surrounding said lamp and being substantially coextensive with said lamp; said quartz jacket being substantially transparent to ultraviolet radiation;
    a source of cooling liquid connected to said liquid-conducting jacket and circulating cooling liquid down the length of said jacket; said lamp being thermally coupled to said cooling liquid, whereby a portion of the heat produced by said lamp is transferred to said cooling liquid and is removed from the vicinity of said lamp; means for deionizing said cooling liquid;
    an elongated curved reflector means at least partly surrounding said lamp and intercepting at least a part of the radiation of said lamp and reflecting and generally focusing a part of said radiation into said generally focused band;
    and means connected between said power source means and said substrate for reducing power to the lamp when the speed of said substrate is decreased below a given value; said lamp being unshuttered and being capable of continuing to illuminate said substrate when the speed of said substrate is descreased below said given value.

12. The lamp assembly of claim 11 which further includes hood means for enclosing said lamp assembly and exhaust means for removing ozone from within said hood means.

13. The device of claim 11 wherein said reflector means comprises a reflective coating formed on an outer surface region of said jacket.

14. The device of claim 1, wherein said elongated liquid-conducting jacket includes a thickened area formed in the walls of said jacket and defining an elongated convex lens, said thickened area being disposed generally on the side of said lamp which is opposite to the side facing said reflector means.

15. An ultra violet lamp assembly for producing a generally focused band of ultraviolet radiation comprising in combination:
- an elongated ultraviolet radiation producing lamp having spaced terminals;
- electrical power source means connected to said spaced terminals for energizing said lamp;
- an elongated liquid-conducting jacket, generally circular in cross-section and made of a material which is substantially transparent to ultraviolet radiation, surrounding said lamp and being substantially coextensive with said lamp;
- a source of cooling liquid connected to said liquid conducting jacket and circulating a cooling liquid down the length of said jacket; said lamp being thermally coupled to said cooling liquid, whereby a portion of the heat produced by said lamp is transferred to said cooling liquid and is removed from the vicinity of said lamp; means for deionizing said cooling liquid;
- the cross-section of said liquid conducting jacket defining a thickened bottom region which gradually tapers to a thinner section in the fashion of a convex lens, whereby the liquid in said cylinder defines a focusing lens for radiation from said lamp; and
- elongated curve reflector means at least partially surrounding said lamp and intercepting at least part of the radiation of said lamp and reflecting and generally focusing a part of said radiation into said generally focused band.

16. An ultraviolet lamp assembly for producing a generally focused band of ultraviolet radiaiton comprising, in combination:
- an elongated ultraviolet radiation producing lamp having spaced terminals;
- electrical power source means connected to said spaced terminals for energizing said lamp;
- an elongated liquid-conducting jacket surrounding said lamp and being substantially coextensive with said lamp, said jacket comprising a single cylinder surrounding and being radially spaced from said lamp whereby said cooling liquid is in direct contact with the outer-diameter of said lamp, said cylinder being of a material which is substantially transparent to ultraviolet radiation;
- a source of cooling liquid connected to said liquid conducting jacket and circulating a cooling liquid down the length of said jacket, said lamp being thermally coupled to said cooling liquid, whereby a portion of the heat produced by said lamp is transferred to said cooling liquid and is removed from the vicinity of said lamp; means for deionizing said cooling liquids;
- elongated curve reflector means at least partially surrounding said lamp and intercepting at least a part of the radiation of said lamp and reflecting in general a part of radiation into said generally focused band.

17. The device of claim 16 wherein the cross-section of said liquid-conducting jacket defines a thickened bottom region which gradually tapers to a thinner section in the fashion of a convex lens, whereby the liquid in said cylinder defines a focusing lens for radiation from said lamp.

18. An ultraviolet lamp assembly for producing a generally focused band of ultraviolet radiation comprising, in combination:
- an elongated ultraviolet radiation producing lamp having spaced terminals;
- an electrical power source means connected to said spaced terminals for energizing said lamp;
- an elongated liquid-conducting jacket surrounding said lamp and being substantially coextensive said lamp, said jacket being substantially elliptical in cross-section and being comprised of a material which is substantially transparent to ultraviolet radiation;
- a source of cooling liquid connected to said liquid conducting jacket and circulating cooling liquid down the length of said jacket, said lamp being thermally coupled to said cooling liquid, whereby a portion of the heat produced by said lamp is transferred to said cooling liquid and is removed from the vicinity of said lamp; means for deionizing said cooling liquid; and
- a reflective coating formed on an outer surface region of said jacket, said lamp being located along a focus of said elliptically shaped jacket whereby said coating intercepts at least part of the radiation of said lamp and focuses a part of said radiation into said generally focused band.

* * * * *